United States Patent [19]

Balzarini et al.

[11] 4,275,451

[45] Jun. 23, 1981

[54] METHOD OF AND APPARATUS FOR TESTING OF MASS-PRODUCED ARTICLES

[75] Inventors: Giovanni Balzarini, Sesto-Calende; Giovanni Buccino, Crenna di Gallarate; Jules Gnadeberg, Gavirate; Roberto Papeschi, Milan; Giancarlo Slavich, Besozzo, all of Italy

[73] Assignee: U.S. Philips Corporation, New York, N.Y.

[21] Appl. No.: 58,582

[22] Filed: Jul. 18, 1979

[30] Foreign Application Priority Data

Aug. 2, 1978 [IT] Italy ............................ 26402 A/78

[51] Int. Cl.³ ........................................... G06F 15/46
[52] U.S. Cl. ................................... 364/580; 364/478; 364/552; 364/900
[58] Field of Search ............... 364/580, 579, 478, 900, 364/551, 552

[56] References Cited

U.S. PATENT DOCUMENTS

| 3,559,451 | 2/1971 | Hyer et al. ............................ 73/1 R |
| 3,704,362 | 11/1972 | Kolby et al. ..................... 364/468 X |
| 3,899,915 | 8/1975 | Williams, Jr. et al. ................ 73/1 R |
| 3,996,568 | 12/1976 | Sturm et al. .......................... 364/900 |
| 4,060,052 | 11/1977 | Algeri et al. ..................... 364/468 X |

Primary Examiner—Edward J. Wise
Attorney, Agent, or Firm—Thomas A. Briody; William J. Streeter; Laurence A. Wright

[57] ABSTRACT

In a method for testing mass-produced articles a test cycle is run during transport of said articles from a first predetermined position to a second predetermined position. During said transport the articles are provided with a connection to an electric mains for supplying the article with operational power, with a control means for controlling the article through a predetermined series of program steps for simulating a cycle of operational use, sensing means for sensing an operational condition of said article and storing means for indiscriminately storing output signals of said sensing means. Upon arrival at said second predetermined position said storing means is connected to a data processing means, whereby the signals stored therein are processed for rendering an indication concerning the performance of the article. For obviating the need for installing specific sensor elements within the article a principle quantity measured is the level and variation of the input current consumed by the article under test (at a constant mains voltage) during the execution of the successive program steps. If the mains voltage is variable in time, the variation is properly corrected for during the measurements.

10 Claims, 13 Drawing Figures

METHOD OF AND APPARATUS FOR TESTING OF MASS-PRODUCED ARTICLES

BACKGROUND OF THE INVENTION

The invention generally refers to a method of and apparatus for testing mass-produced articles, and in particular electrically-driven articles which have an appreciable weight and/or volume and which would require a test sequence of appreciable duration. Non-delimiting examples of such articles are household appliances such as washing machines and refrigerators, or (semi)-industrial devices such as lead-acid batteries solar heat-exchange panels or ovens. It is detrimental to the manufacturing process that in such cases a test of all articles would require a physically large buffer storage. Furthermore, the execution of an extended test program for each article would require a large amount of signalling between a test-program controller, the article under test, a sensing means for sensing specific operational conditions of the article and human operators and/or a computer for analyzing the test data and possible processing. This processing may be necessary for two reasons. In the first place, the data of a single article may be processed for determining the acceptability of its performance, such as by averaging of raw data, curve fitting, or by determining weak spots. In the second place, the data from a large number of articles may be used for determination of the correctness of certain process parameters, such as an oven temperature or the composition of a chemical bath. Said signalling to human operators would be very time-consuming. If processing were done on-line with the articles under test it would readily interfere with the throughput in the manufacturing.

SUMMARY OF THE INVENTION

It is an object of the present invention to provide a testing method and apparatus for mass-produced articles whereby input and output of the testing area are at precisely predetermined positions, whereby the testing cycle is executed to a large extent automatically and autonomously, whereby the total amount of test data becomes available to a processing means as a whole, enabling such correlations and staticizing as required by the nature of the article and/or of the manufacturing process, and whereby the data transmission lines, such as are required do not interfere with the remainder of the process. To this end, the method according to the invention is characterized by the steps of:

(a) installing said article on a conveyor means at a first predetermined position;
(b) connecting said article to an electric power means for providing operational power to said article;
(c) connecting sensing means to said article for sensing at least one time-dependent operational condition of said article;
(d) under automatic control driving said article through a predetermined series of program steps for simulating a cycle of operational use thereof;
(e) during said control, conveying said article from said first predetermined position to a second predetermined position and storing predetermined output signals from said sensing means in a digital storage means selectively coupled to said sensing means;
(f) upon arrival at said second predetermined position, disconnecting said article from said electric power means and said sensing means;
(g) temporarily connecting said storage means to a data processing means for reading out and processing said predetermined output signals stored therein for thereupon generating a test data;
(h) removing said article from said conveyor means.

The provision of a conveying step transfers the tolerances in throughput velocity between the testing process and the remainder of the production to the time domain, thereby making the physical space to be devoted to the testing process independent of time. In this way only a single, fixed, routing needs to be provided. Furthermore, a separation in time between the sensing and data processing operations obviates the necessity for a data BUS-line, and the corresponding complicated interrogation or interrupt organization fo servicing a plurality of article test stations. Also, such a BUS-system would need sliding data contacts thereto with a high level of inherent noise disturbance. In case of fixed contacts, alternatively, the lines could mechanically get entangled in the movement of the conveyor line. Also, such on-line data acquisition and off-line data processing yield a well balanced load for the data processing apparatus, leading to a reduced capacity requirement. The above indicated steps would be very advantageous in case some thermal equilibrium would have to be established to ascertain the operation of the article under test. Notably, the process as described does not apply to the testing of semiconductor memories and the like. For these articles both test times and article bulk would be so much smaller as to render the problems encountered hereabove virtually negligible.

FURTHER ASPECTS OF THE INVENTION

Advantageously, the sensing means senses the current level as delivered to the article and is capable of measuring the electric power consumed in the article during at least one of the steps. In this way an important operational condition of the article is simply measured, thereby facilitating the connection and disconnection of the article by human operators. As long as the provided power voltage is constant the current level directly indicates the power consumed. With variation of the power voltage provided a conventional calculation yields the power consumed. Advantageously, the sensing means senses a substantial change in the current level which indicates a transition from a first step to a second of said step. This obviates a need for the programming means of the article to signal the transition, further simplifying the signal transfer between the article and the sensing means.

Advantageously, for testing an article having an electric motor the sensing means senses a ripple signal on the current level which indicates the rotary speed of the electric motor during at least one of the steps. This further obviates the necessity for connecting a tachometer to the article. However, in addition to the above described derivation of several operational conditions from the instantaneous values of voltage and current, separate sensors (such as temperature, humidity, or audio noise level sensors) may be added to the sensing system.

Preferably, the sensing means has the capability of counting successive periods of the ripple signal during a predetermined time interval for indicating the rotary speed. Thereby, the resulting count is directly proportional to the rotary speed and no further data conversion is necessary. Alternatively, it would also be feasible to have the sense means sensing the length of the period of the ripple signal for indicating the rotary speed. This yields a further elementary method for determining such speed.

Advantageously, the sensed substantial change provides a signal to store enabling the storage means for a prevailing signal of the operational condition. In this way for one or more of the steps a simple means for storing only a single value of the operational condition has been provided.

In parallel with the foregoing, the invention relates to an apparatus for testing an article within a series of articles during an automatically controlled driving thereof through a predetermined series of program steps for simulating a cycle of operational use thereof, the apparatus comprising a conveyor means having an input position and an output position, and a plurality of positioning means each for accommodating an article, electric power means having a plurality of outlets each corresponding to one of the positioning means for providing electric power to an article, a plurality of sensing means having a corresponding plurality of sensing inputs each corresponding to one of the positioning means for sensing at least one operational condition of an article placed thereat, a plurality of separate digital storage means each assigned to one of the positioning means for storing an output signal from a sensing means corresponding thereto, and data processing means provided at a predetermined data output position of the apparatus, the data processing means having an input for thereto temporarily connecting an output of a digital storage means as being presented at the predetermined data output position for therefrom receiving stored signals, the data processing means furthermore having an output for outputting a representation of a test data. The digital storage means may be of quite simple construction for storing the sensing signals from one or only a few of the articles under test. In this way a simple two level data handling system is produced, whereby each level has just the required facilities. The latter corresponds to a situation preferred in large scale operations where the final results of the test always appear at the same position standard processing thereof having been executed already. In this way a certain hierarchical organization of the data handling system is realized, thereby gaining appreciable advantages, for example in that less instrumental duplication is required.

Advantageously, the digital storage means has a clock for driving a cyclic interrogation of a plurality of sensing signals from a sensing means corresponding thereto. With the result that a central clock pulse system is not needed.

Advantageously, the apparatus acts as test an article having an internal circuit which contain a fluid, whereby at least a first one of the program steps would involve a substantial increase of a filling degree of the internal circuit and at least a second one of said program steps would involve a substantial decrease of said filling degree, and wherein an additional channel for the fluid is provided along at least part of the distance between the input position and the output position, and wherein furthermore for each of said positioning means there is provided fluid presenting means and fluid draining means for increasing and decreasing, respectively, the filling degree by connecting at least one part of the article with the fluid in the channel. In this way all or part of the fluid may be recycled. Also, if one or more program steps would involve heating of the fluid above ambient temperature, energy and testing time may be saved by keeping the fluid in the channel somewhat above ambient temperature (but below the temperature to be attained within the article if also the heating step should be monitored). The opposite applies if only a cooling step to below ambient temperature is envisaged.

Advantageously, the conveyor means and the channel form corresponding closed loops. In this way, several elements may be simplified. For example, the fluid draining means may now be simple draining pipes ending above the channel and be fixed to said positioning means.

The invention may be better understood with reference to the detailed description that follows and to the drawings.

DETAILED DESCRIPTION OF THE INVENTION

Figure 1:
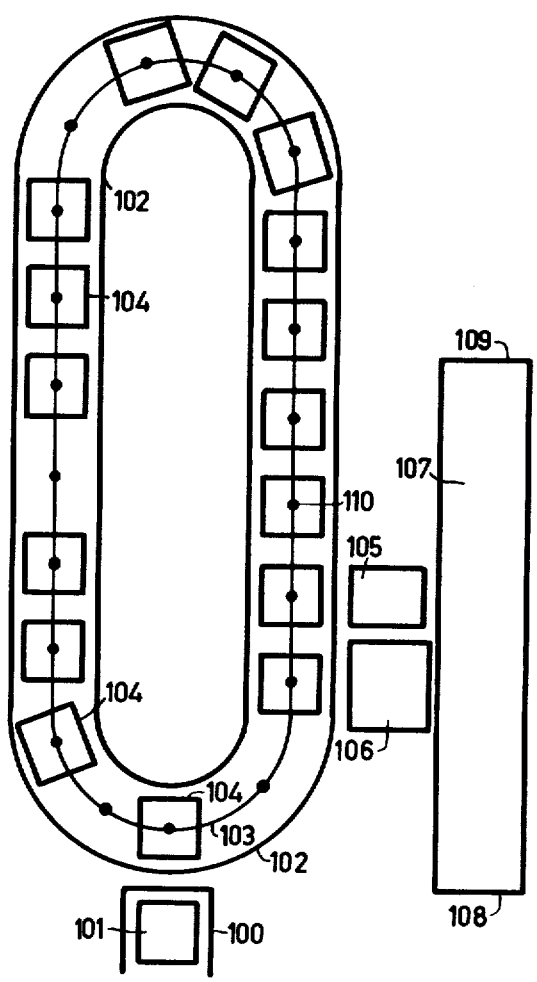
FIG. 1 shows a general outline of a conveying means.

FIG. 1 shows a general outline of a conveying means for use in a test operation of washing machines. Element 100 is an entry conveying means whereby washing machine 101 is delivered from an earlier production step. It is supposed that washing machine 101 is a functionally complete item to such a degree that the steps to be described with respect to the test program are meaningful. Certain non-essential steps in the production process may have however, been left out for later execution. The test run proper is executed on a conveyor which has a closed loop form and which may consist of a conveyor chain 103 provided with a conventional drive means, not shown and further with the required power connections for each of the 20 possible positions for an article which have been indicated by a dot. Each position has been provided with positioning means such as a platform of the required size. Each position may, or may not, contain an article 104: as indicated, four positions are unfilled. Element 102 indicates either a free path for the articles, or alternatively, subsidiary guiding means such as rollers. At the intersection of conveyors 100 and 102/3 the articles arriving are positioned on conveyor means 103, for example, by a human operator controlling a lifting machine. Furthermore the article is electrically connected to the mains by way of connecting it to an electric socket which travels with the said moveable position. Said electric socket may provide one or more operational voltages, such as 110 volts AC, 220 volts AC, etcetera as required. Furthermore, one or more water pumps are provided which also travel along the conveyor means in synchronism with the motion of the positioning means along the conveyor. At each of said positions for an article an output connection of the water supply as provided by said pump or pumps is provided. Such output connection is connectable to the normal water inlet of a washing machine present at the corresponding position. Said output connections may be connected to the pump corresponding thereto by a flexible hose to allow for the non-linear motion of the conveyor means. The inlet of the pump(s) is connected by means of a sliding hose to an open water reservoir running along the complete circumference of the conveyor line such that the hose never needs to leave the water. Furthermore, at each of said positions an outlet pipe is provided which travels with said position and is connectable to the normal water outlet of a washing machine at said position. Thereby said water outlet may be connected to said water reservoir such that the tub of the washing machine may be drained at any required position along said conveyor line. Also means are provided at each position for controlling the washing machine according to a preferred operational program, said controlling means in the example to be described being the conventional timer with which the washing machine is provided. It is to be understood that said controller could have certain positions or execute certain steps which would be only useful for a test program. Alternatively, a special test controller could be present at each of the positions on said conveyor line which would have been designed specifically for the purpose of testing. Furthermore, sensing means are present at each of said positions for sensing certain operational conditions to be described of said washing machines, an output of the sensing means being connected to an input of a locally provided digital storage means to be described. Said controlling means, said sensing means, and said storage means are connected to a mains in a conventional way for power supply and travel with the conveyor means. In certain cases sensing means and/or digital storage means could be shared among two or more positions along said conveyor means. During the transport along the conveyor 102 a certain test program is executed, the nature thereof being dependent on the controlling means which may be adapted for testing a single type of article, or alternatively, two or more different controlling means may be provided for use on selective types of articles which are run on the testing system as a product mix. Upon arrival at position 110 the test program should have been completed. To such effect, the nominal length of such program must be designed somewhat shorter than it takes the conveyor line to transfer a washing machine from the intercept with conveyor line 100 to position 110. At the latter position the sensing means may be disconnected from the washing machine, whereby, also, the digital storage means have a data output connected to a data input of computer 105 which receives the data stored and after processing thereof yields a test result.

Element 106 is a transfer conveyor, on which the washing machines are placed after disconnecting of electric connections to the mains and connections to the water supply and outlet means at that position. The washing machine will reach thereupon transfer conveyor 107 which has a first output 108 and a second output 109. The test result may generally fall into each of three different categories: the first category is that the article has passed its test, either unconditionally (quality: good) or conditionally (quality: sufficient). In that case the quality level may be imprinted on a label attached to the article and it will thereupon be forwarded to position 109 for such further steps in manufacture as are required, for packaging, and for storing until delivery. The second category is that the article is beyond repair. In that case it is also conveyed to output 109 for such disassembly as considered useful and for subsequent scrapping. The third category is that repair is necessary and useful, and in that case the article is conveyed to the repair area at output 108, whereupon it may after repair be routed again along conveyor 100 for a further test cycle. For simplicity the construction of conveyor 107 and the nature of the repair are not discussed further.

In the above indicated example computer 105 is dedicated to the testing system as described. Alternatively, computer 105 may be assigned to more than one of such testing systems. Alternatively, a plurality of such testing systems could be provided with their dedicated computers, whereby a further computer were provided as a master for receiving the processed test data from computers such as computer 105, and whereby said master computer would make an overall statistical analysis. Further, still higher levels of computing power could be added, either for detailed analysis of a percentage of all tested articles or for calculating further specific test quantities.

Figure 2:
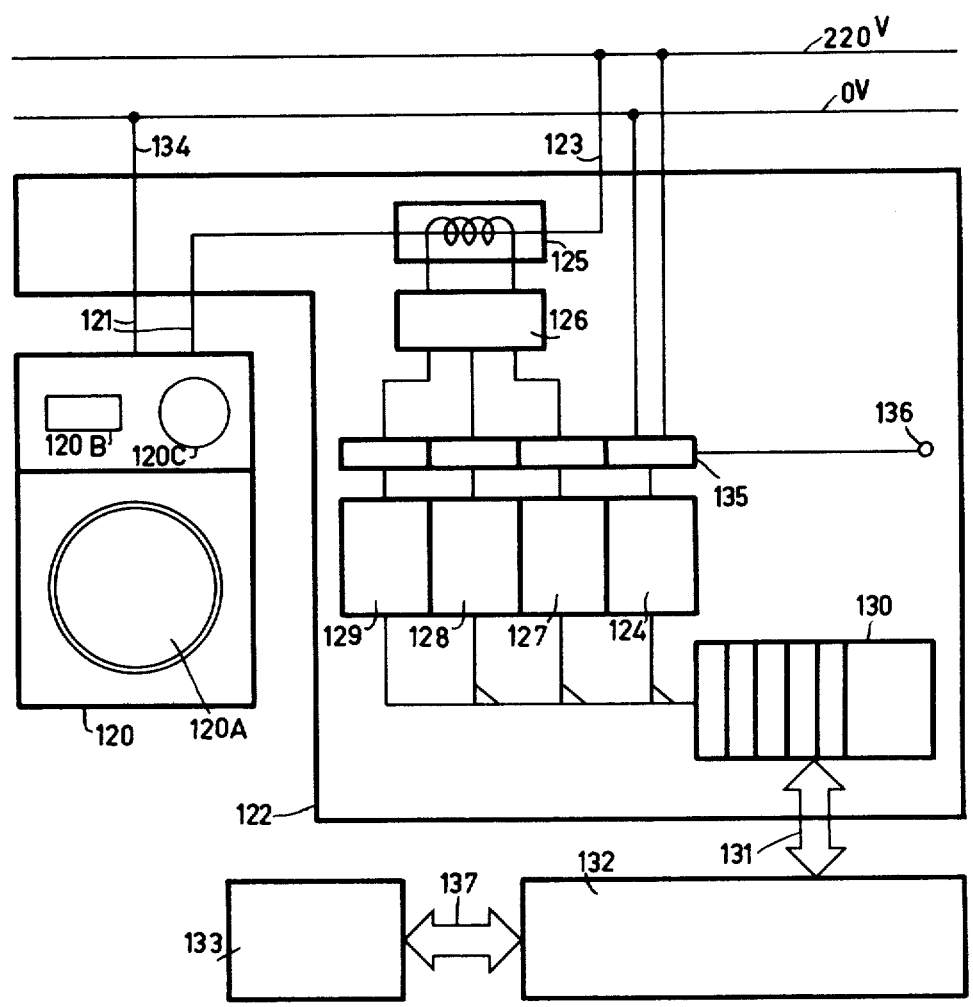
FIG. 2 shows a schematic arrangement of an article, a test box, and a data processing means.

FIG. 2 shows an arrangement of article under test, a test box having sensing means and digital storage means, and a data processing means. Element 120 is a conventional washing machine for household use, for example of the type Philips AWF 606/G. Notable features of said washing machine are the tub door 120A in the lower part thereof and the switch buttons for on/off and control lights at 120B and the master controller at 120C in the upper part thereof, respectively. As already said before, the washing machine is connectable to water inlet and outlet means not shown. It is furthermore connected by its normal supply electric cord 121 to a test box 122, the shielding connection not being shown for simplicity. Said test box in the first place along line 123 receives the positive mains voltage, for example 220 volts AC. In the second place line 134 is connected to the other power connection at zero volts. In this way appropriate electric power is provided to the article under test.

A first quantity to be measured is the mains voltage V which therefore is communicated via an interface element 135 to a first analog to digital converter 124. The interface element will be explained later. A second quantity to be measured is the supply current I which is derived from a supply lead using a conventional current transformer 125. The output signal of this current transformer by way of a suitable filter 126 to be described and interface element 135 communicated to a second analog to digital converter 127 and to first and second counters 128, 129, respectively. The output signals of elements 124, 127, 128, 129 are systematically stored in the word positions of memory 130 so that within each successive four words the sequence among the four quantities so determined is the same. At each substantial change of the current delivered to the article 120 four words of memory 130 are written in to contain the prevailing test values, whereby a predetermined sequence of the addresses is always maintained. Interface element 135 is controlled by a signal on connection 136. At the end of a test cycle line 121 may be disconnected. Furthermore, line 131 may be connected to a conventional microcomputer 132 which in this example is a central processing unit of the Intel 80/10 system. Under control of this computer the stored data from memory 130 are read out. The data from test box 122 in untreated form may contain a Go-no Go-indication, for example if the timer of the washing machine got stuck and therefore, memory 130 had not been filled to a sufficient degree. In the second place computer 132 runs an analyzing program on the test data and executes the following tasks:
(1) it calculates corrected values of current, time, and rotary drum speed values during the succession of program steps.
(2) it checks the values determined against predetermined limits which are stored in said computer.
(3) it controls the printout of the quantities thus calculated while furthermore indicating any excess of such quantities outside prescribed tolerance regions.
(4) it generates and prints a signal indicating the acceptability level of the article thus tested.
(5) it has conventional capability for taking part in a dialogue with a human computer operator by means of conventional peripheral means.
(6) it may execute such staticizing and analyzing of the data generated for calculating feed-back signals for the process as required (for example indicating a test box which is only marginally operative, when a certain test box generates results which differ significantly from the output signals of other test boxes: a D/A converter, for example could be defective).

Computer 132 furthermore by bidirectional line 137 is connected to a conventional peripheral device 133 which contains a printer-cum-keyboard arrangement wherein the human operator may enter certain commands for computer 132 and wherein test reports for all tested articles are produced featuring a fixed format which could for a washing machine be as follows. For each of the sequence of program steps of heating, slow rhythm, normal rhythm, draining, prespinning and spinning the current level, the time duration and the rotary speed are printed out. If required, computer 132 may further staticize the test results for determining whether certain process parameters may advantageously be modified.

A first signal value on terminal 136 may permanently disable interface element 135. A second signal value, which may be manually applied by a human operator at the start of a test run enables interface element, whereby the quantities to be measured arrive at further elements 124, 127-129 described hereabove.

Figure 3A:
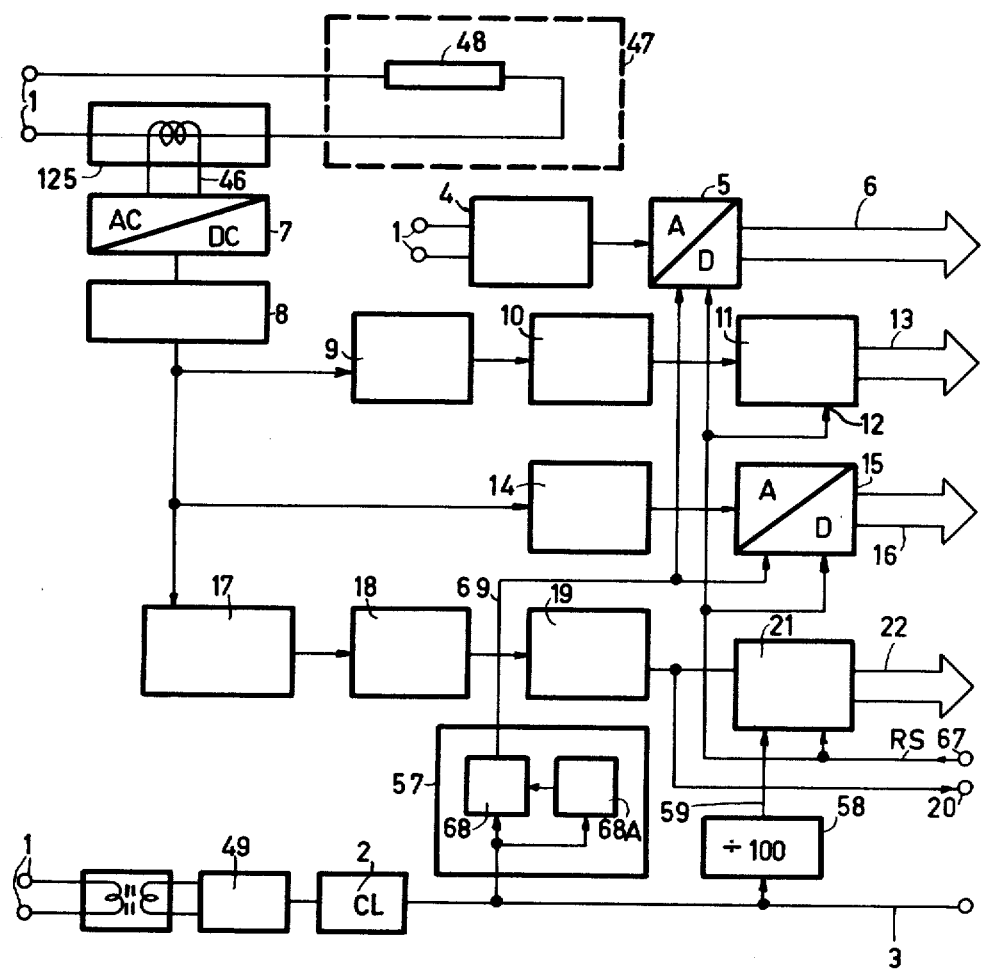
FIGS. 3a, 3b show an exemplary test-box for deriving and storing digital quantities.
Figure 3:
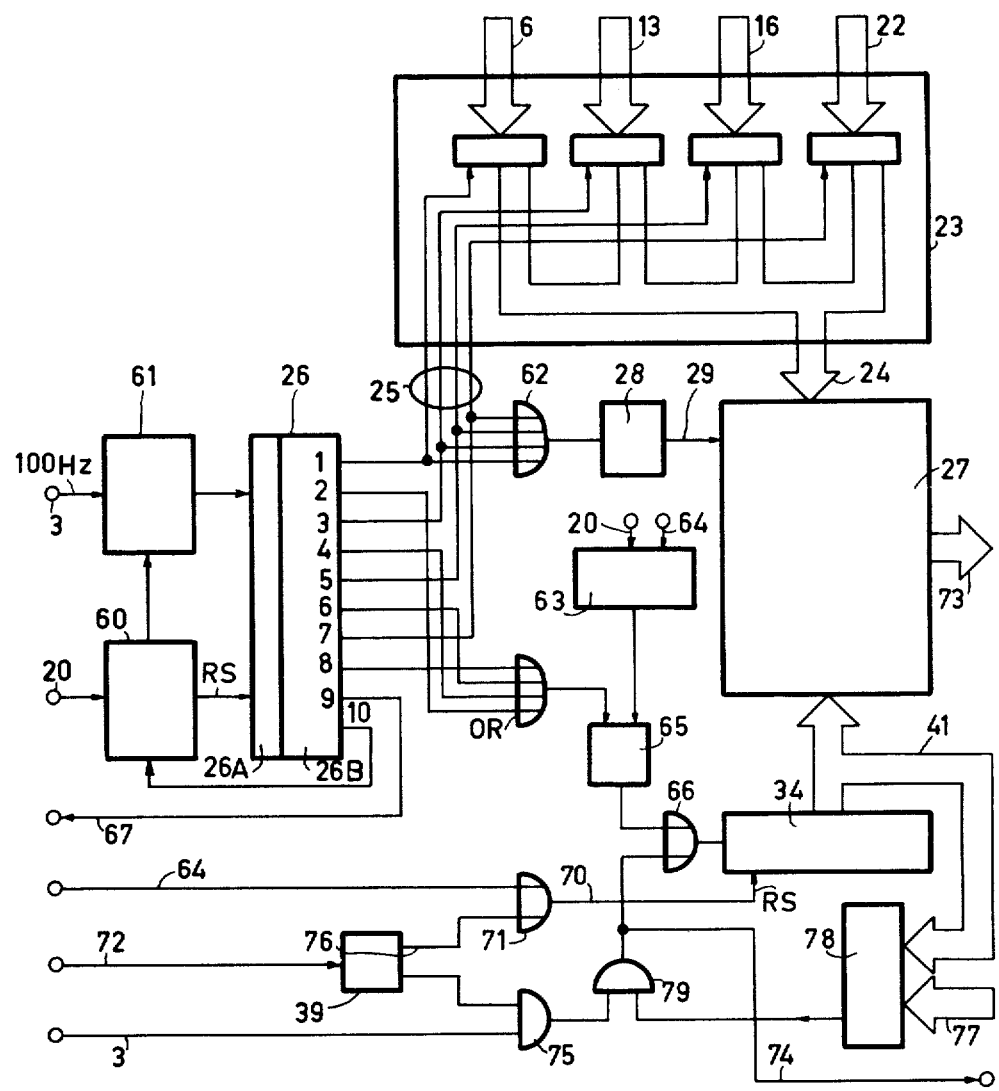

FIGS. 3a, 3b show an exemplary test box such as element 122 in FIG. 2 for driving and storing digital quantities representing an operational condition of an article under test, for example a washing machine. On the input side, shown in FIG. 3a, reference 1 indicates a connection to a supply voltage such as 220 volts, 50 Hz AC. As shown in FIG. 2, in the first place, power is provided to washing machine 47, which has a schematically indicated internal impedance 48. Furthermore, in similar way, this connection 1 supplies current to a clock generator 2 of conventional construction which supplies a clock pulse with a repetition frequency of 100 Hz on line 3. By suitable stabilization this frequency is nearly independent of the possibly somewhat variable supply voltage. The clock generator receives power via conventional double rectifier 49. Output 3 of clock generator is connected to a blocking element 57 to be discussed hereinafter. Furthermore, the supply voltage on connection 1 is rectified and smoothed in AC/DC converter 4 and the resultant DC voltage is interrogated in analog-digital converter 5 under control of the clock pulses on line 69. The resultant 8-bit output signal is produced on line 6. Furthermore, the outputs of current transformer 125 (compare FIG. 2.) are connected by way of line 46 to rectifier 7. The signal therein is rectified and passes through a low-pass filter 8 which has a 3 dB point at about 20 Hz. By means of this low-pass filter (12 dB/octave) the harmonics of the supply frequency are rendered indetectable by later elements of the circuit. The output of low-pass filter 8 is first connected to an input of high pass filter 9 which has a 3 dB frequency at about 15 Hz and a slope characteristic of 12 dB/octave. The output signal of filter 9 therefore lies within a frequency band of about 15-20 Hz, the exact frequency corresponding to the nominal rotation frequency of the drum of the washing machine in the high speed or "spinning" mode. The current ripple is caused by the fact that the "drum" of the washing machine always represents a certain imbalance, which translates to corresponding variations in the current. For other rotary speeds a corresponding pass band would have to be chosen. If a plurality of rotary speeds must be checked, for each such speed a separate band pass filter would have to be provided. For simplicity, this has not been indicated in the drawing. Of course, such different rotary speeds would need sufficient spacing. The output of filter 9 is connected to the input of zero-crossing detector 10 which therefore produces two pulses during each revolution of the drum of the machine. These pulses are counted in counter 11 which has a reset input 12 and an 8-bit data output 13 for continual interrogation. The pulse counter 11 may internally have a higher capacity than eight bits. In that case, only the eight most significant bits would be presentable on line 13. Now, in this way the number of revolutions between two successive reset signals on input 12 may be counted, which number is proportional to the rotary speed. Furthermore, the output of low-pass filter 8 is connected to an input of a further low pass filter 14 having a 3 dB frequency at about 5 Hz and a characteristic slope of 12 dB/octave. This filter thus generates an output signal which is representative for the instantaneous current level and which is converted in analog-to-digital converter 15 to an 8-bit representation of the current value on line 16 each time a clock signal appears on line 69. Finally, the output signal of low-pass filter 8 is connected to an input of differentiating member 17. The output signal thereof is doubly rectified in rectifier 18 to generate an indication of positively or negatively directed changes in the current consumed. The output signals of rectifier 18 are treated in pulse shaper 19 which suppresses signals below a predetermined level and converts all signals of higher amplitude to a predetermined signal shape, for example a narrow block with a length of a few milliseconds. Such preshaped signals are unconnected to ripples in the current due to the rotation of the basket or to the 50 Hz component of the supply frequency, but represent significant steps in the value of the current supplied to the washing machine, under influence of a transition to a succeeding step in the test program. Element 58 is a divider by 100 and receive the 100 Hz clock pulses from clock pulse generator 2. Therefore, line 59 transports a 1 Hz clock pulse frequency for being counted in counter 21. This counter may produce an 8-bit count signal on line 22 which may therefore indicate a time interval up to 256 seconds (4'16"). The "spikes" on line 20 ae used to control the start and stop operations of counter 21. This is effected in such a way that a "spike" received stops the counting and after a predetermined time interval reenables the counting (within said time interval readout and reset may, or may not be effected, as required). The eight bit signals from element 5 (voltage), 11 (speed), 15 (current) and 21 (time) are conducted to four-way, 8-bit multiplexer 23 in FIG. 3b which may transmit a single one of these four quantities to the data BUS 24, under control of an appropriate one-out-of-four-signal pulse on the four fold line 25. The "spikes" one line 20 one furthermore forwarded to counter controller 60 in FIG. 3b, which mainly consists of a two-position device. Upon reception of a spike signal, controller 60 goes to its first position, thereby unblocking clock inhibiter 61. Furthermore, this transition produces a reset to zero signal RS for counter arrangement 26. The latter comprises a four bit (16 position) stage 26A, and decimal counter stage 26B. Th clock inhibiter 61 receives the clock pulses on line 3 and therefore is independent from element 57. If the clock inhibiter 61 transmits the 100 Hz clock pulses received, stage 26A operates as a divider by 16, whereby stage 26B is advanced every 160 milliseconds. When stage 26B reaches position 10, this drives counter controller 60 to its second position, whereby clock inhibiter 61 becomes operative for blocking further clock pulses to counter arrangement 26. Counter state 26B in the first place controls the writing operations in memory 27 for writing in the test data. Memory 27 has RAM capability and a capacity of 256 words at 8 bit each. When decimal counter stage 26B, by a carry signal from stage 26A, is driven to certain positions thereof to wit positions 1, 3, 5, 7 respectively, it delivers a selection pulse on four bit line 25 for each time gating a corresponding quantity of those arriving at lines 6, 13, 16, 22, respectively, to data BUS 24. Furthermore, the signals of said positions 1, 3, 5, 7 are ORED in OR-gate 62. Write pulse shaper 28 thereupon generates an appropriate write pulse for memory 27 on line 29.

The signals of positions 2, 4, 6, 8 of counting stage 26B are ored in OR-gate 30 for generating an address stepping signal for memory 27. The spikes generated by element 19 in FIG. 2a are communicated to element 63. Upon initialization of the test box, a manual reset signal is entered at input 64. This drives element 63 to its first position. The first spike received drives element 63 its second position, only the latter position being operative for unblocking gate 65. A high signal from gate 65 steps 8 bit binary address counter 34 by one via OR-gate 66. In this way all addresses (as far as required) of memory 27 are successively filled. The first transition (to the first test step) does not cause any address incrementation in counter 34, because operational conditions before that instant are irrelevant to the outcome of the test. Position 9 of counter stage 26B on line 67 produces a reset signal which is conveyed to the arrangement of FIG. 3a for resetting elements 5, 11, 15 and 21 to the zero position. Position 10 of counter stage 26B sets counter controller 60 to its second position for thereupon reblocking clock inhibiter 61 until reception of the next "spike".

Element 57 in FIG. 3a contains a blocking element 68. At the instant of reception of a "spike" on line 20 this two-position device is reset to the blocking situation whereby line 69 no longer transmits clock pulses. In this way, the prevailing contents of elements 5, 11, 15, 21 are retained. Delay element 68A has a delay time which is sufficient for counter arrangement 26 in FIG. 3b to execute a full revolution (about 1.6 seconds) under uninterrupted clock pulse flow on line 3. Thereafter, line 69 receives further clock pulses without blocking in element 68. In this way the writing sequence in the address series of memory 27 is controlled. The total amount of data stored in memory 27 only depends on the program executed in the article under test. Notably such program may be changed without necessitating further changes in the arrangement of FIGS. 3a, b. Only in case of memory 27 having an insufficient capacity, a larger store may be introduced, together with an address counter 34 providing an extended address length. If required reset line 70 of address counter 34 may receive a reset signal at the beginning of the test cycle via OR-gate 71. The corresponding input signal at terminal 64 may be applied manually.

For the read out operation, memory 27 has its data out bus 73 and strobe line 74 connected to the microcomputer system INTEL 80/10 cited hereabove. Furthermore, terminal 72 receives an external command for initializing the read out, which signal may be applied manually or under automatic control. Data out controller 39 has two positions the first thereof being activated by said external command for thereupon unblocking AND-gate 75 for the 100 Hz clock pulses on line 3 from clock pulse generator 2 in FIG. 3a. Furthermore said activation generates, e.g. by differentiation, a pulse on signal line 76 for resetting address counter 34 to the zero position. The cited microcomputer is further connected to data BUS line 77 for providing an 8-bit signal indicating the upper address boundary. Said data may be stored in an 8-bit register, not shown for clarity. The address data from address counter 34 along bus-line 41 is conveyed to comparator 78. As long as the data on line 77 is greater than the data on line 41, comparator 78 delivers a logical "1" for enabling AND-gate 79. The latter gate then will transmit clock pulses to OR-gate 66 for stepping address counter 34, and furthermore, on line 74 as a strobe signal for microcomputer INTEL 80/10. When the data on lines 77 and 41 become equal, transmission halts. The clock signal from gate 66 may conventionally be used for further synchronizing the operation of memory 27. Therefore, during read-out of memory 27, the arrangement of FIGS. 3a, 3b operates as the master.

Figure 4:
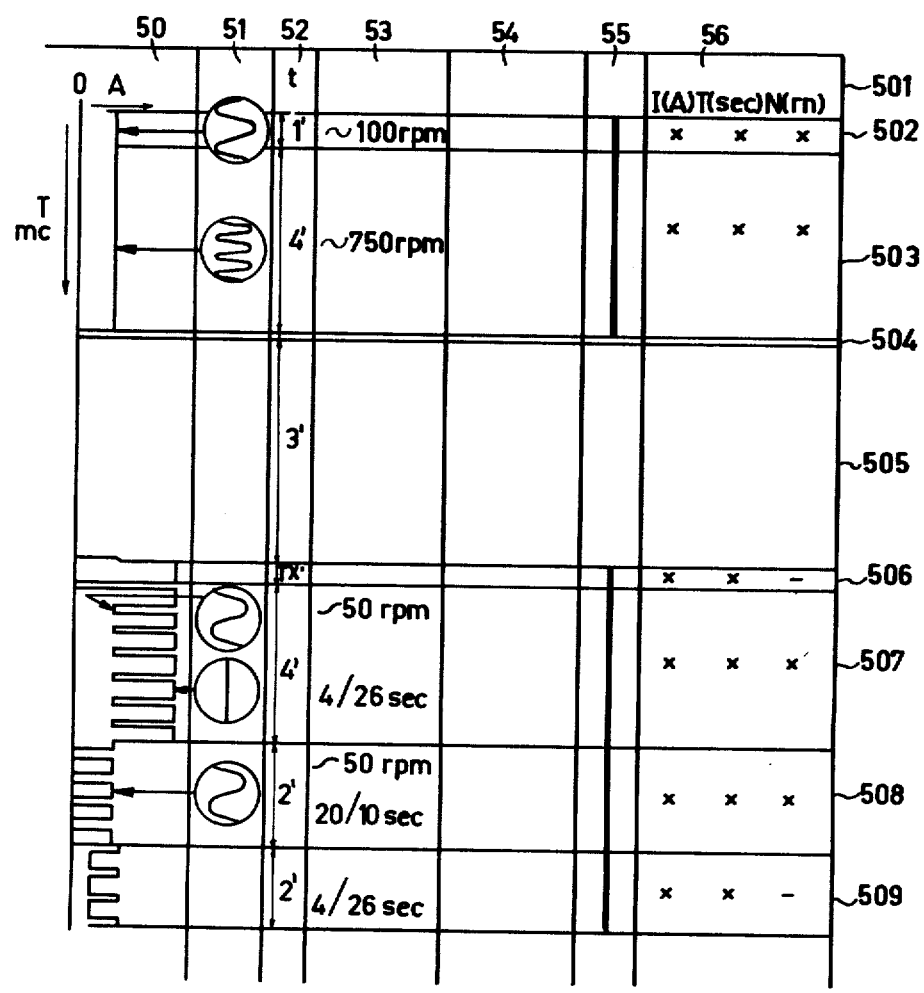
FIG. 4 gives a detailed example of a test sequence for a washing machine.

FIG. 4 gives a detailed example of a test sequence for a normal washing machine for home use. Column 50 represents the general outline of the current consumed. Column 51 represents the modulations on the current in column 50 on a short time scale as present under respective operational conditions. Column 52 bears an indication of the time consumed by the respective operational steps. Column 53 represents respective operational functions to wit: pre-spinning, spinning, stop, filling with water, heating, rotating at a slow speed, rotating at normal speed, and the combination of washing and draining movements respectively. It should be noted tha the above is not a normal sequence of functions during a washing operation, while, however, each step on its own represents a realistic step in such a sequence (or a combination of such steps). Column 54 represents operations by a human operator supervising the test conveyor line. Column 55 represents the state of the test, which may be operational or non-operational. Column 56 repesents the relevance of the respective quantities: current (I), time lapsed (T), and rotational speed (N) determined by the sensing means, whereby a cross indicates that the corresponding quantity is relevant, a bar, that it is not. At the start of the test the washing machine is connected to the voltage supply, the timer thereof is set to the position 8+1, meaning at "major position 8" while being advanced further by one "minor step". This is a position normally encountered during certain washing operations. Furthermore, no additional control means are applied in this relatively elementary example, and the test box is initialized by providing it with a starting signal. During the first step of one minute a relatively low-speed spinning is executed at 100 rpm. During the next step of four minutes a relatively high-speed spinning is executed at 500 -700 rpm. During these first two intervals all three mentioned quantities are relevant. When the timer stops at its final position (note that normally spinning is a final step in a washing operation) the test box gets a stop signal and the timer is manually set at its position 2+3. Thereafter, a three minute interval is used for the filling of the "tub" of the washing machine. When the tub is full, the test box is started again whereupon the water is heated which may take an undetermined time as this step is only terminated when the water in the vessel has reached a certain temperature. Furthermore, the length of this interval may be shortened by filling the vessel with pre-heated water at a temperature of, for example, about 40° C. In the next period of four minutes the "slow rhythm" is executed which consists of alternating operations of 4 seconds revolving at a normal washing speed of about 50 rmp without further heating and 26 seconds heating at zero speed. Therefore, only the low-current intervals (motor) have an appreciable ripple. This step takes four minutes. In the next step of two minutes the so-called normal rhythm is executed which consists of alternate periods of twenty seconds rotation (as in the preceding step) and ten seconds standstil, without heating. During these last two steps successive pairs of rotations may each time be opposed to each other. In the next step of two minutes the draining pump is actuated for draining the tub of the washing machine. Note that the current through the pump is relatively low and that the current for rotating the basket (each time during four seconds, alternated by a 26 seconds standstill period is lower than during the preceding step. At the end of this step the test box is stopped, the washing machine is disconnected from the test box and the power supply, and the test box is connected to the data processing means. The nature of the data processing is not the subject of the present invention and will, therefore, not be described further. Inclusive of the heating and the connecting/disconnecting operations the test program described above takes about 25 minutes, whereby every 60 seconds a new washing machine may enter the process. The revolving time of the conveyor may be, for example, about 30 minutes. In the above, several faults would be easy recognizable by the computer from the data stored. Several malfunctions are: the programmer stops before termination of the program; the heating takes to much time; one or more rotary speeds are outside of the limits; one or more current levels are outside of preset limits, etcetera. Certain of these may be repaired, as is well known in the relevant art.

In the above, the test sequence was controlled by the normal timer internally to the washing machine. On the other hand, the derivation of the test results was exclusively done in the test box shown in FIGS. 3a, 3b. This separation is not a prerequisite. Notably in case the article contained a microprocessor for normal control, part of the signal preprocessing could be executed by said microprocessor, which would then be hooked up to an external test box. Alternatively, in certain cases, the test sequence could be run under partial or whole control by a sequencer internally to the test box.

Figure 5:
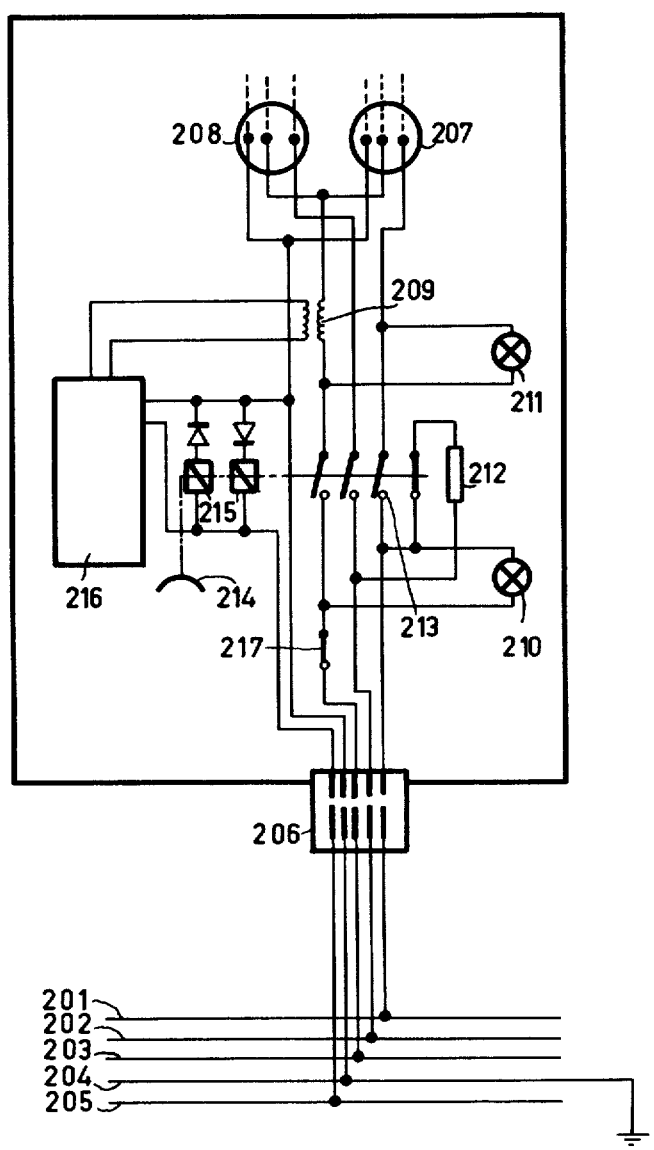
FIG. 5 gives a simplified test box for use with a test on refrigerators.

FIG. 5 shows a simplified test box for use with a test on household refrigerators. Such articles have only two states, namely on and off. A very important paramter is the time from the starting instant up to the first closing down of the cooling mechanism. Connection to the power is provided by a five-pole connector 206, whereby the following lines are provided: 201 at 220 volts AC, 202 at 110 volts AC, 203, the return line of the power supply at zero volts, 204 the ground terminal, and 205, an auxiliary line. At 207, 208 two outlets for 220, and 110 volts articles are provided, each with a protective ground connection. At 210 is the power supply indicator lamp. At 209 is the current transformer for feeding the testing devices proper. Item 212 is a load resistor which draws current if both 220 volts and 110 volts are supplied. Element 213 is a four fold switch for selectively supplying power voltages to the outlets. Element 214 is a manual button for controlling the closing of the switch 213. Elements 215 are two latching relays for opening the switch 213 under control of a signal emanating from testing device 216 or emanating from line 205 respectively. Thus the test may be self-terminating. Element 217 is a protective circuit breaker. Element 211 is an indicator lamp signalling that the switch 213 is closed. The connection for connecting element 216 to the data processing means has not been shown. An additional difference with the testing of washing machine is that the cooling time is quite dependent on the ambient temperature, and also, on the type of the refrigerator. Therefore, the time counter, such as element 21 in FIG. 3a is provided with specific preloading in similar way as the provision of a data to comparator 78 in FIG. 3b. The contents of the counter upon generation of the "spike" signal (refrigerating cycle finished) must now lie between prescribed limits, which can be independent of ambient temperature and type. This facilitates testing of a mixed arrangement of articles.

Other article types may be controlled in similar way: for a lead-acid battery one or more whole or partial load-unload cycles would be executed; for a solar panel a radiating source would be used to simulate natural solar radiation, and for other article types the operational use would be simulated in like manner.

Figure 6A:
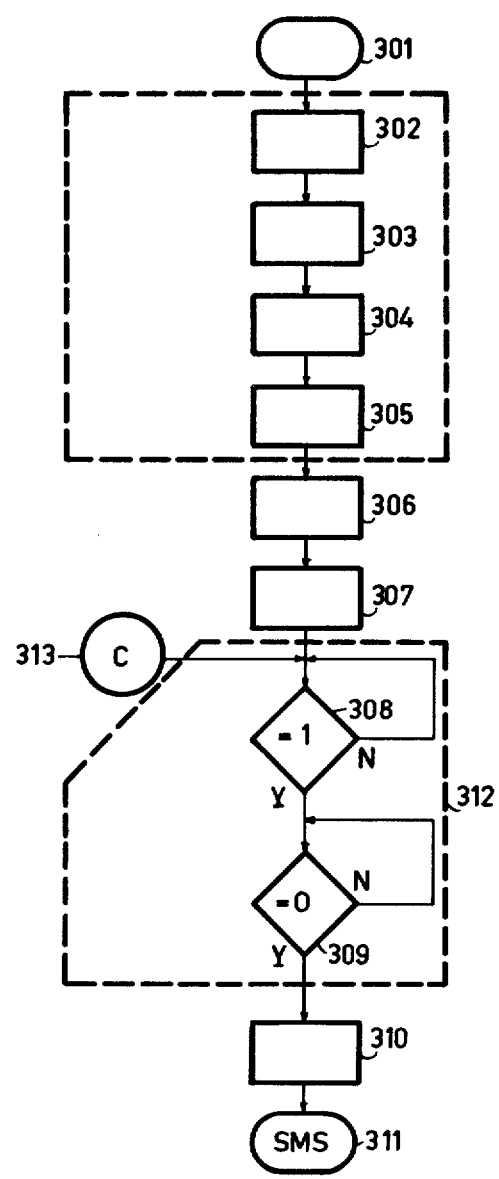
FIGS. 6a-6g give a flow diagram of a test sequence.
Figure 6B:
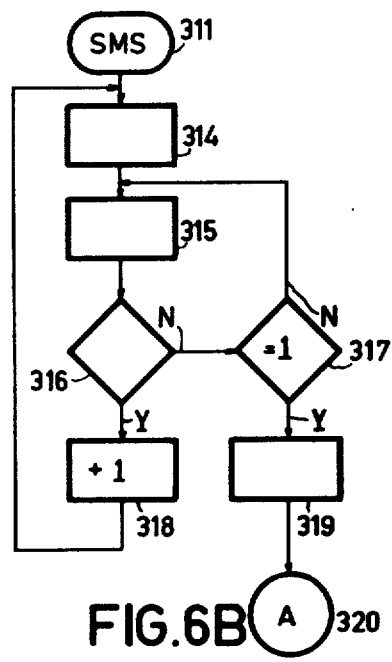
Figure 6C:
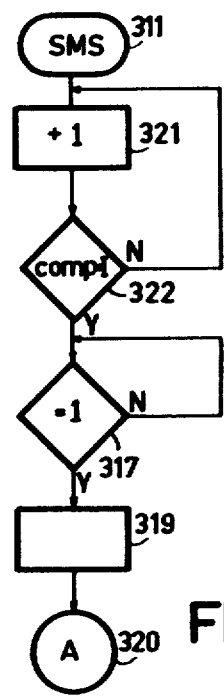
Figure 6D:
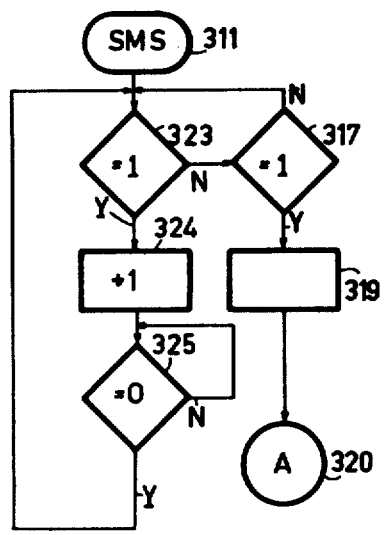
Figure 6E:
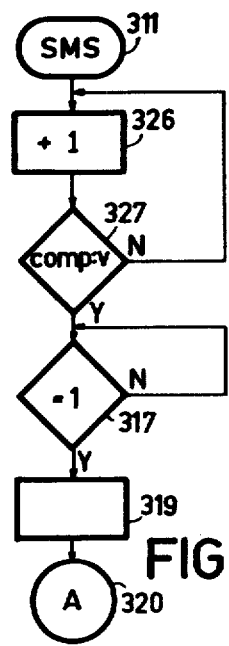
Figure 6F:
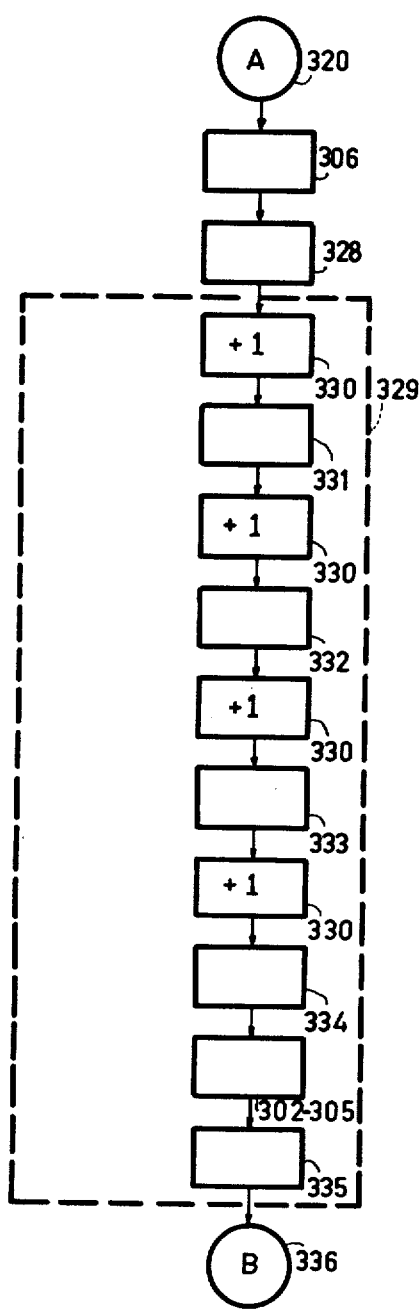
Figure 6G:
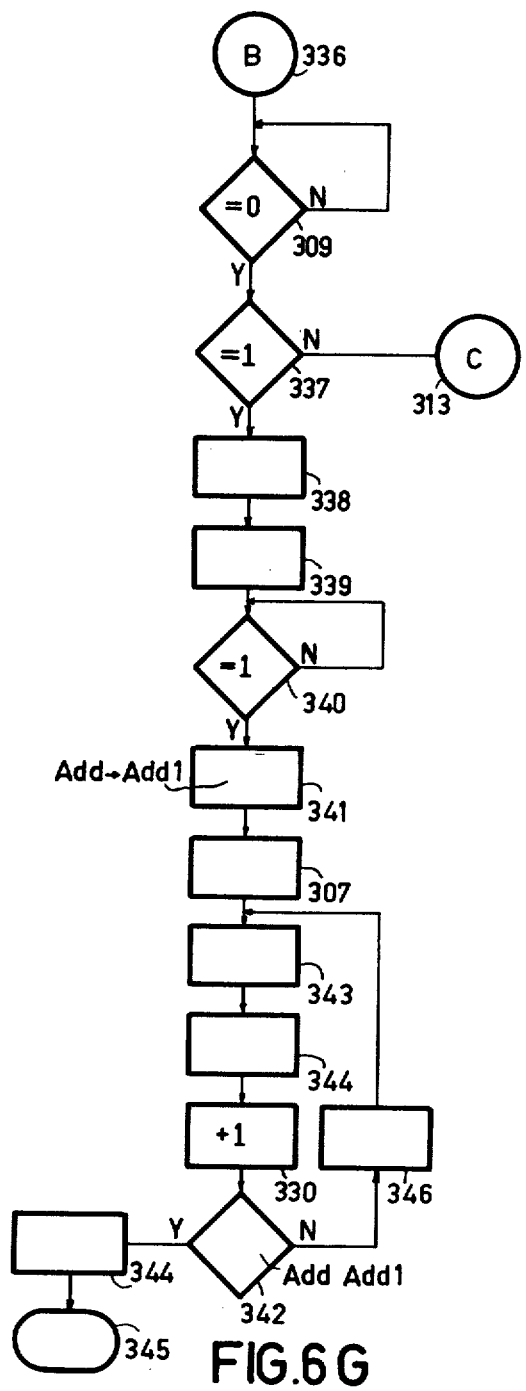

FIGS. 6a-6g show the flow chart of the washing machine test. FIG. 6a shows the initialization. At position 301 is the starting point. Item 302: Reset time counter; 303: reset speed counter; 304: reset A/D current counter (ramp converter); 305: reset A/D voltage counter; 306: reset decimal counter (26); 307: reset RAM address counter; 308 is spike level logical 1? (Y=-positive; N=negative); 309: is spike level logical 0?; 310: start 100 Hz clock and counters; 311: start measuring sequences; 312: spike pulse test; 313: entry C. FIG. 6b shows the time counter sub-cycle. Item 314: reset divider by 100 (element 58); 315: increment divider by 100; 316: has element 58 reached position 100? 317: is spike level logical 1?; 318: increment time counter (element 21); 319: stop 100 Hz clock: 320: output A. FIG. 6c shows the sub-cycle for the A/D converter for the current (element 15). Item 321: increment A/D-converter ramp counter; item 322: is counter position equal to current level? FIG. 6d shows the sub-cycle for the measurement of the rotary speed of the drum. Item 323: is a spike signal "1" present from zero crossing detector 10?; 324: increment counter 11; 325: is a spike signal "0" present from zero crossing detector 10? FIG. 6e shows the sub-cycle for the measurement in the A/D converter for the voltage. Item 326: increment A/D converter ramp counter; 327: is counter position equal to the voltage level? FIG. 6f shows the sub-cycle for writing data in memory 27. Item 328: start counting in element 26; 329: writing cycle proper; 330: increment address counter 34; 331: select voltage byte in selector 23 and store in memory; 332: select current byte in selector 23 and store in memory; 333: select rotary speed byte in selector 23 and store in memory; 334: select time byte in selector 23 and store in memory; 335: stop counter arrangement 26; 336: output B. FIG. 6g shows the read out sub-cycle. Item 337: is the stop command (comparator 78) present?; 338: stop the counter counting 100 Hz clock pulses (to this effect comparator 78 could inhibit element 57 for transmitting further clock pulses); 339: enable 100 Hz clock pulses for synchronizing the data out operation (element 79); 340: is data out command equal to "1"?; 341: in memory of microcomputer execute instruction Add→Add 1 for determining message length for comparator 78; 343: set strobe signal 344: control data byte out on line 73; 342: compare RAM address to Add 1; 346: reset strobe signal; 344: disable 100 Hz clock pulses; 345: END.

What is claimed is:

1. Method for testing an article within a series of mass-fabricated articles to be tested, said method comprising the steps of:
    (a) installing said article on a conveyor means at a first predetermined position;
    (b) connecting said article to an electric power means for continuously providing operational power to said article;
    (c) connecting sensing means to said article for measuring at least one time-dependent operational condition of said article;
    (d) under automatic control by a digitally operating control device that is self-controlled and during the test co-located within the respective article driving said article through a predetermined series of program steps for simulating a cycle of operational use thereof;
    (e) during said control conveying said article from said first predetermined position to a second predetermined position and storing predetermined measurement signals from said sensing means in a digital electronic storage means selectively coupled to and co-located with said sensing means;
    (f) upon arrival at said second predetermined position disconnecting said article from said electric power means and said sensing means;
    (g) temporarily connecting said digital electronic storage means to a data processing means for reading out and processing said predetermined measurement signals stored therein for thereupon generating a test data;
    (h) removing said article from said conveyor means.

2. A method as claimed in claim 1 wherein said measuring means have means for sensing a current level as delivered to said article as a measure for the electric power consumed in said article during at least one of said steps.

3. A method as claimed in claim 2 wherein said measuring means have means for sensing a substantial change in said current level as indicating a transition from a first of said steps to a second of said steps.

4. A method as claimed in claim 3 for testing an article having an electric motor wherein said sensing means have means for measuring a ripple signal on said current level as indicating a rotary speed of said electric motor during at least one of said steps.

5. A method as claimed in claim 4 wherein said sensing means have means for counting successive ripple signals during a predetermined time interval as indicating said rotary speed.

6. A method as claimed in claim 3 wherein said sensed substantial change provides a signal for enabling said storage means for storing a prevailing signal of said operational condition.

7. Apparatus for testing an article within a series of articles during an automatically controlled driving thereof through a predetermined series of program steps for simulating a cycle of operational use thereof, said apparatus comprising a conveyor means having an input position and an output position and a plurality of positioning means each for accommodating an article, electric power means having a plurality of outlets each corresponding to one of said positioning means for providing electric power to an article, a plurality of sensing means having a corresponding plurality of sensing inputs each corresponding to one of said positioning means for measuring at least one operational condition of an article placed thereat, a plurality of separate electronic storage means each assigned to one of said positioning means for storing an output signal from a sensing means corresponding thereto, and data processing means provided at a predetermined data output position of said apparatus, said data processing means having an input thereto for temporarily connecting an output of a digital electronic storage means as being presented at said predetermined data output position for therefrom receiving stored signals, said data processing means furthermore having an output for outputting a representation of a test date.

8. Apparatus according to claim 7, wherein said digital electronic storage means has a clock for driving a cyclic interrogation of a plurality of sensing signals from sensing means corresponding thereto.

9. Apparatus according to claim 7 or 8, for testing an article having an internal circuit for containing a fluid whereby at least a first one of said program steps would involve a substantial increase of a filling degree of said internal circuit and at least a second one of said program steps would involve a substantial decrease of said filling degree, and wherein an additional channel for said fluid is provided along at least part of the distance between said input position and said output position, and wherein furthermore for each of said positioning means there are provided fluid presenting means and fluid draining means for increasing and decreasing, respectively, said filling degree by connecting at least one part of said article with the fluid in said channel.

10. Apparatus according to claim 9, wherein said conveyor means and said channel form corresponding closed loops.

* * * * *